(12) United States Patent
Masakawa et al.

(10) Patent No.: US 9,620,178 B1
(45) Date of Patent: Apr. 11, 2017

(54) MEMORY SYSTEM CONTROLLING POWER SUPPLY AND CONTROL CIRCUIT FOR CONTROLLING POWER SUPPLY

(71) Applicant: Kabushiki Kaisha Toshiba, Minato-ku (JP)

(72) Inventors: Takahiro Masakawa, Itabashi (JP); Fuminori Kimura, Yokohama (JP); Ryosuke Tomioka, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/050,812

(22) Filed: Feb. 23, 2016

Related U.S. Application Data

(60) Provisional application No. 62/271,696, filed on Dec. 28, 2015.

(51) Int. Cl.
*G11C 5/14* (2006.01)
*G11C 29/00* (2006.01)
(Continued)

(52) U.S. Cl.
CPC ............. *G11C 5/147* (2013.01); *G11C 5/14* (2013.01); *G11C 5/148* (2013.01); *G11C 7/20* (2013.01);
(Continued)

(58) Field of Classification Search
CPC .. G11C 5/14; G11C 5/148; G11C 7/20; G11C 11/4072; G11C 13/0038; G11C 29/83
See application file for complete search history.

(56) References Cited

U.S. PATENT DOCUMENTS 5,535,169 A * 7/1996 Endo ................. G11C 11/406
365/189.04
6,172,931 B1 * 1/2001 Cha ..................... G11O 5/145
365/193
(Continued)

FOREIGN PATENT DOCUMENTS

JP          6-236964         8/1994
JP          2010-258267      11/2010

*Primary Examiner* — Vanthu Nguyen
(74) *Attorney, Agent, or Firm* — Oblon, McClelland, Maier & Neustadt, L.L.P.

(57) ABSTRACT

According to one embodiment, there is provided a memory system including a $1^{st}$ memory group, a $2^{nd}$ memory group, a power supply voltage adjustment circuit, a $1^{st}$ line, a $1^{st}$ switch, a $2^{nd}$ line, a $3^{rd}$ line, and a $4^{th}$ line. The power supply voltage adjustment circuit includes a $1^{st}$ terminal and a $2^{nd}$ terminal. The $1^{st}$ line electrically connects the $1^{st}$ terminal to the $1^{st}$ memory group. The $1^{st}$ switch includes a $3^{rd}$ terminal, a $4^{th}$ terminal, and a $5^{th}$ terminal. The $1^{st}$ switch electrically connects the $3^{rd}$ terminal to the $4^{th}$ terminal when turned on. The $2^{nd}$ line electrically connects the $1^{st}$ terminal to the $3^{rd}$ terminal. The $3^{rd}$ line electrically connects the $4^{th}$ terminal to the $2^{nd}$ memory group. The $4^{th}$ line electrically connects the $2^{nd}$ terminal to the $5^{th}$ terminal.

20 Claims, 9 Drawing Sheets

(51) Int. Cl.
*G11C 7/20* (2006.01)
*G11C 11/4072* (2006.01)
*G11C 13/00* (2006.01)

(52) U.S. Cl.
CPC ...... *G11C 11/4072* (2013.01); *G11C 13/0038* (2013.01); *G11C 29/83* (2013.01)

(56) References Cited

U.S. PATENT DOCUMENTS

| | | | |
|---|---|---|---|
| 6,978,411 B2* | 12/2005 | Huang | G11C 29/56012 324/73.1 |
| 7,116,603 B2* | 10/2006 | Kanda | G11C 16/20 365/225.7 |
| 7,696,649 B2 | 4/2010 | Frey et al. | |
| 7,782,701 B2* | 8/2010 | Seo | G11O 5/14 365/226 |
| 8,929,171 B2* | 1/2015 | Park | G11C 16/04 365/185.02 |
| 9,275,755 B2* | 3/2016 | Kim | G11C 11/40615 |
| 9,343,117 B1* | 5/2016 | Lee | G11O 5/145 |
| 2005/0082579 A1* | 4/2005 | Horii | G11C 16/26 257/222 |
| 2010/0302891 A1* | 12/2010 | Wang | G11O 5/14 365/226 |
| 2015/0070056 A1* | 3/2015 | Tanadi | H01L 25/117 327/143 |

* cited by examiner

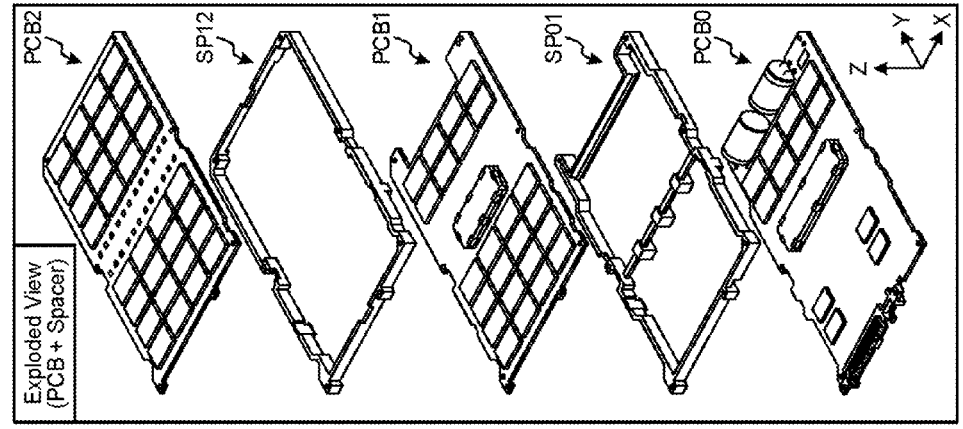
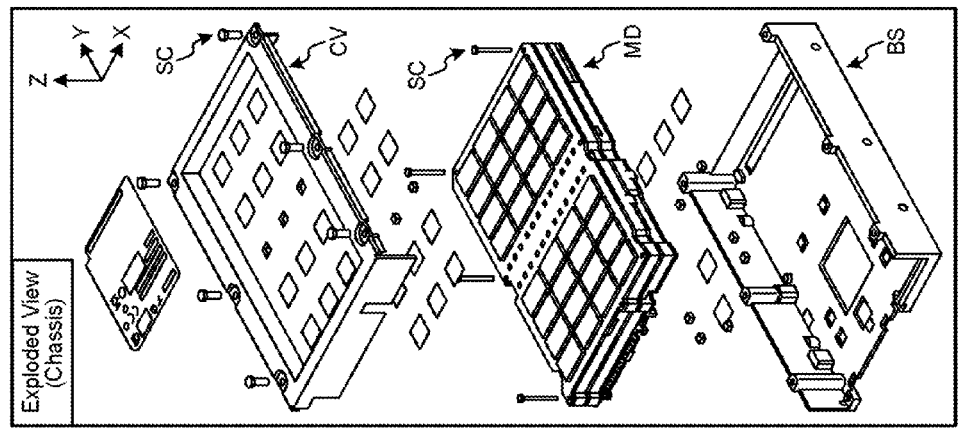
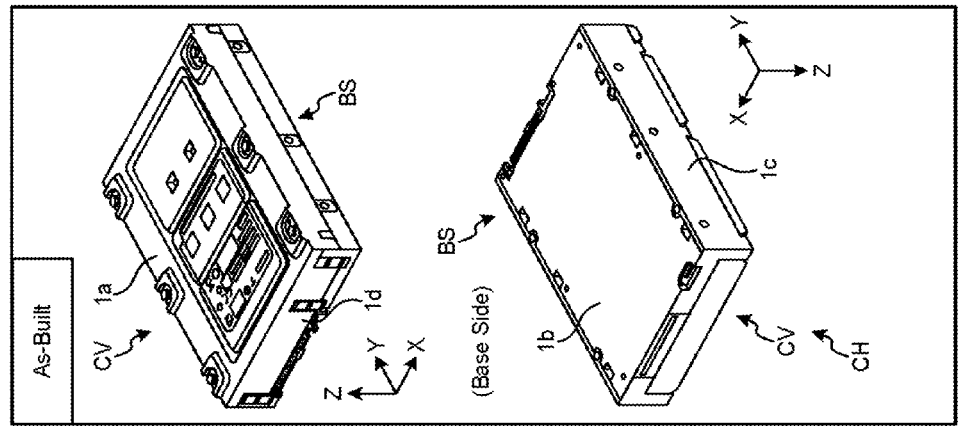

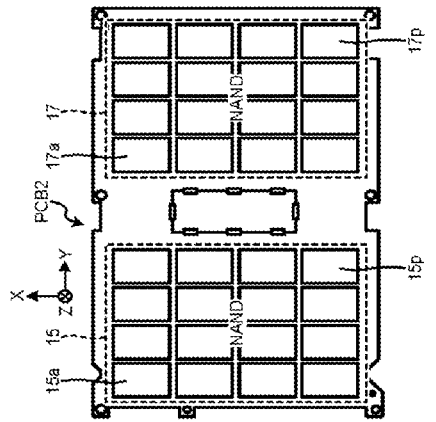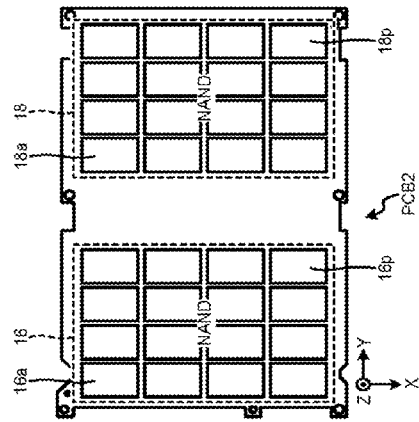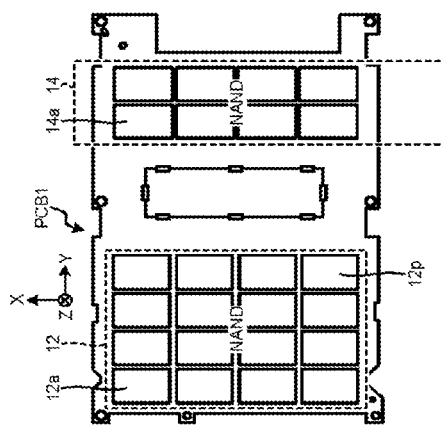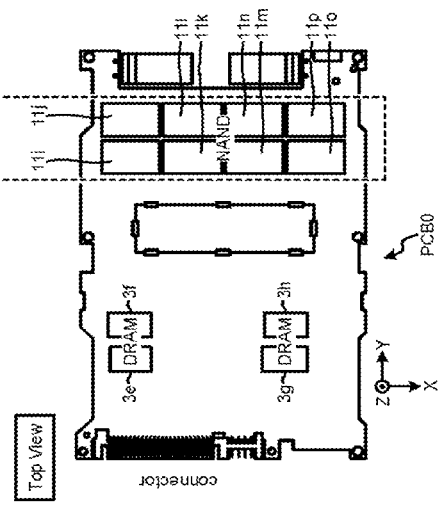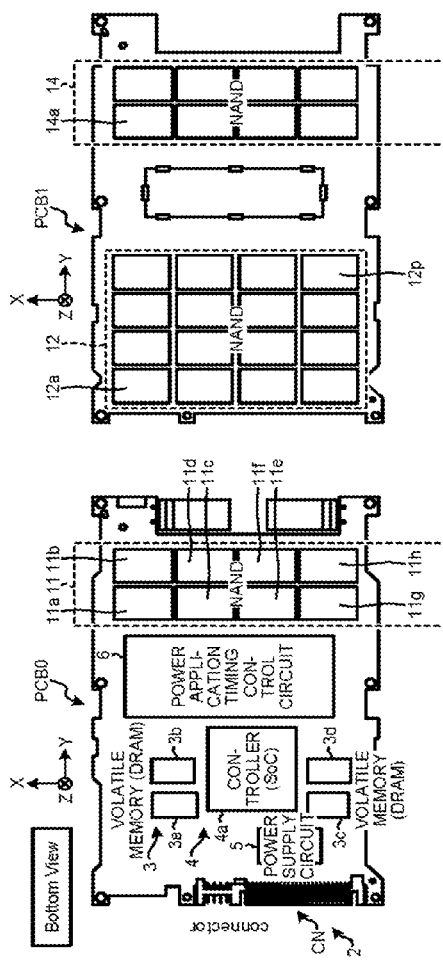

MEMORY SYSTEM CONTROLLING POWER SUPPLY AND CONTROL CIRCUIT FOR CONTROLLING POWER SUPPLY

CROSS-REFERENCE TO RELATED APPLICATIONS

This application is based upon and claims the benefit of priority from U.S. Provisional Application No. 62/271,696, filed on Dec. 28, 2015; the entire contents of which are incorporated herein by reference.

FIELD

Embodiments described herein relate generally to a large capacity memory system and a control circuit.

BACKGROUND

In the case of a memory system, such as an SSD (Solid State Drive), which is equipped with a plurality of memory groups, an electric power is applied to each of the memory groups, when the system is started up. At this time, it is desired to suppress occurrence of a peak of electric current in each of the memory groups.

BRIEF DESCRIPTION OF THE DRAWINGS

FIGS. 1A to 1C are perspective views each showing a configuration of a memory system according to an embodiment;

FIGS. 2A to 2F are plan views each showing a configuration of the memory system according to the embodiment;

DETAILED DESCRIPTION

In general, according to one embodiment, there is provided a memory system including a $1^{st}$ memory group, a $2^{nd}$ memory group, a power supply voltage adjustment circuit, a $1^{st}$ line, a $1^{st}$ switch, a $2^{nd}$ line, a $3^{rd}$ line, and a $4^{th}$ line. The power supply voltage adjustment circuit includes a $1^{st}$ terminal and a $2^{nd}$ terminal. The it line electrically connects the $1^{st}$ terminal to the $1^{st}$ memory group. The $1^{st}$ switch includes a $3^{rd}$ terminal, a $4^{th}$ terminal, and a $5^{th}$ terminal. The $1^{st}$ switch electrically connects the $3^{rd}$ terminal to the $4^{th}$ terminal when turned on. The $2^{nd}$ line electrically connects the $1^{st}$ terminal to the $3^{rd}$ terminal. The $3^{rd}$ line electrically connects the $4^{th}$ terminal to the $2^{nd}$ memory group. The $4^{th}$ line electrically connects the $2^{nd}$ terminal to the $5^{th}$ terminal.

Exemplary embodiments of a memory system will be explained below in detail with reference to the accompanying drawings. The present invention is not limited to the following embodiments.

Embodiment

Figure 3:
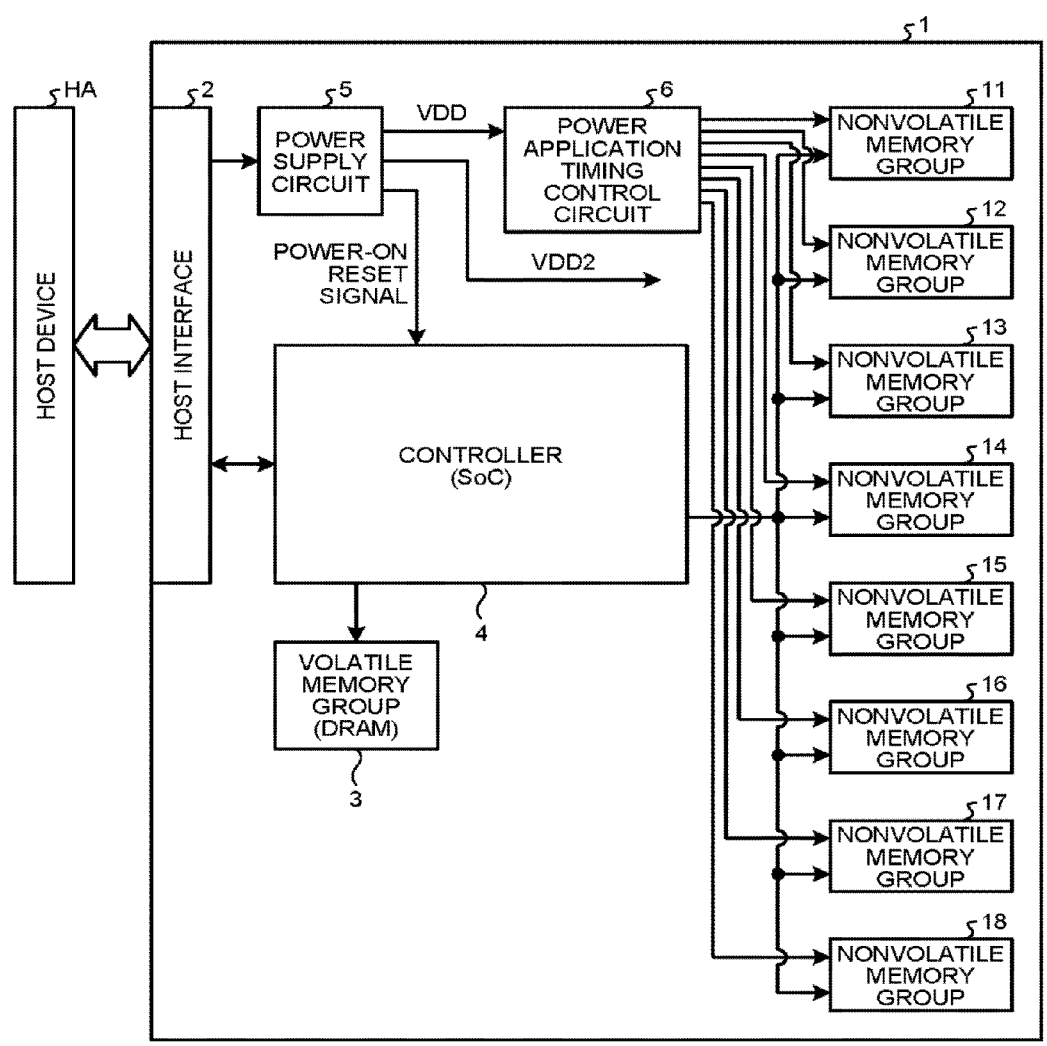
FIG. 3 is a block diagram showing a configuration of the memory system according to the embodiment.

An explanation will be given of a memory system 1 according to an embodiment, with reference to FIGS. 1A to 1C, 2A to 2F, and 3. In FIGS. 1A to 1C and 2A to 2F, for the sake of convenience, it is assumed that the short-side direction of the top surface or bottom surface of the memory system 1 having a rectangular shape is an X-direction, its long-side direction is a Y-direction, and its thickness direction (board stacking direction) is a Z-direction. FIG. 1A is a perspective view showing an appearance configuration of the memory system 1. FIGS. 1B and 1C are exploded perspective views each showing a configuration of the memory system 1. FIGS. 2A to 2F are plan views each showing a configuration of the memory system 1. FIG. 3 is a block diagram showing a configuration of the memory system 1. Here, a concrete mounting form of the configuration shown in FIG. 3 is exemplified by FIGS. 1A to 1C and 2A to 2F, but is not limited to this example.

For example, the memory system 1 is formed of an SSD (Solid State Drive), and is capable of being connected to a host apparatus HA in a communicable manner so that it can serve as an external storage medium for the host apparatus HA. For example, the host apparatus HA may include an information processing device such as a personal computer, server, or storage box. Or the host apparatus HA may include a mobile phone or imaging device. Or the host apparatus HA may include a mobile terminal device such as a tablet computer or smart phone. Or the host apparatus HA may include a game device. Or the host apparatus HA may include an in-vehicle terminal device such as a car navigation system.

As shown in FIG. 1A, the memory system 1 has an appearance of a flat and rectangular parallelepiped shape, and is formed in a rectangular shape when seen in a plan view (i.e., when seen in the Z-direction). The memory system 1 includes a chassis CH formed by a combination of a cover CV and a base BS. The cover CV forms the top wall $1a$ and the lateral walls $1d$ on the ±Y sides in the chassis CH. The base BS forms the bottom wall $1b$ and the lateral walls $1c$ on the ±X sides in the chassis CH.

As shown in FIGS. 1B and 1C, the memory system 1 includes a plurality of circuit boards PCB0, PCB1, and PCB2. The plurality of circuit boards PCB0, PCB1, and PCB2 are stacked in a spaced apart state and thereby form a module MD. The module MD is composed of the circuit board PCB0, a spacer SP01, the circuit board PCB1, a spacer SP12, and the circuit board PCB2 stacked in this order. The module MD is fixed to the cover CV and/or base BS by screws SC. In the example shown in FIG. 1B, the module MD is fixed to the cover CV. The module MD is contained inside the chassis CH. Each of the circuit boards PCB0, PCB1, and PCB2 is formed as a PCB (printed circuit board).

As shown in FIGS. 2A to 2F and 3, the memory system 1 includes a host interface 2, a volatile memory group 3, a controller 4, a power supply circuit 5, and a plurality of nonvolatile memory groups 11 to 18. FIG. 2A shows a plan view configuration of the circuit board PCB0 seen from the −Z side, and FIG. 2B shows a plan view configuration of the circuit board PCB0 seen from the +Z side. FIG. 2C shows a plan view configuration of the circuit board PCB1 seen from the −Z side, and FIG. 2D shows a plan view configuration of the circuit board PCB1 seen from the +Z side. FIG. 2E shows a plan view configuration of the circuit board PCB2 seen from the −Z side, and FIG. 2F shows a plan view configuration of the circuit board PCB2 seen from the +Z side.

The host interface 2 includes a connector CN. The connector CN may be disposed at an end portion of the circuit board PCB0, for example. The connector CN includes power supply pins and data pins. The host interface 2 is configured to supply data, which has been received from the host apparatus HA via the data pins, to the controller 4, and transmit data, which has been received from the controller 4, to the host apparatus HA via the data pins. Further, the host interface 2 is configured to supply an electric power, which has been received from the host apparatus HA via the power supply pins, to the power supply circuit 5.

The power supply circuit 5 may be mounted as a plurality of components (not shown), at positions near the connector CN, on the circuit board PCB0, for example. The power supply circuit 5 is configured to generate a plurality of different power supply voltages for internal use, from a supplied power supply voltage. For example, the power supply circuit 5 can generate a power supply voltage VDD (such as 1.8V) and a power supply voltage VDD2 (such as 2.5V). The power supply circuit 5 is configured to supply the power supply voltages to the respective circuits inside the memory system 1. Further, the power supply circuit 5 is configured to detect a rise of the external power supply voltage, generate a power-on reset signal, and supply the generated power-on reset signal to the controller 4.

The controller 4 may be mounted as an SoC (System on Chip) package 4a, at a position near the connector CN, on the circuit board PCB0, for example. Inside the SoC package 4a, an SoC chip is contained. The controller 4 totally controls the respective portions of the memory system 1.

The volatile memory group 3 may be mounted as a plurality of volatile memory packages 3a to 3h, at positions near the connector CN, on the circuit board PCB0, for example. In each of the volatile memory packages 3a to 3h, a chip of a volatile memory (such as a DRAM or SRAM) is contained. The volatile memory group 3 is configured to serve as a buffer when a signal (such as command or data) is transmitted to or received from the host apparatus HA or nonvolatile memory groups 11 to 18, and/or serve as a work area for the controller 4.

The plurality of nonvolatile memory groups 11 to 18 are mounted on the plurality of circuit boards PCB0, PCB1, and PCB2. The nonvolatile memory group 11 may be mounted as a plurality of nonvolatile memory packages 11a to 11p, on the −Z side main surface and +Z side main surface of the circuit board PCB0, for example. The nonvolatile memory group 12 may be mounted as a plurality of nonvolatile memory packages 12a to 12p, on the −Z side main surface of the circuit board PCB1, for example. The nonvolatile memory group 13 may be mounted as a plurality of nonvolatile memory packages 13a to 13p, on the +Z side main surface of the circuit board PCB1, for example. The nonvolatile memory group 14 may be mounted as a plurality of nonvolatile memory packages 14a to 14p, on the −Z side main surface and +Z side main surface of the circuit board PCB1, for example. The nonvolatile memory group 15 may be mounted as a plurality of nonvolatile memory packages 15a to 15p, on the −Z side main surface of the circuit board PCB2, for example. The nonvolatile memory group 16 may be mounted as a plurality of nonvolatile memory packages 16a to 16p, on the +Z side main surface of the circuit board PCB2, for example. The nonvolatile memory group 17 may be mounted as a plurality of nonvolatile memory packages 17a to 17p, on the −Z side main surface of the circuit board PCB2, for example. The nonvolatile memory group 18 may be mounted as a plurality of nonvolatile memory packages 18a to 18p, on the +Z side main surface of the circuit board PCB2, for example.

In each of the nonvolatile memory packages 11a to 11p, 12a to 12p, 13a to 13p, 14a to 14p, 15a to 15p, 16a to 16p, 17a to 17p, and 18a to 18p, a plurality of chips of a nonvolatile memory (for example, NAND type flash memory) device are contained in a stacked state. The nonvolatile memory device stores data in a nonvolatile manner. The nonvolatile memory device includes a memory cell array composed of a plurality of memory cells arranged in a matrix format, in which each memory cell may be configured to perform multi-value storage by use of a higher order page and a lower order page. In the nonvolatile memory device, data erasure is performed in units of a block, and data writing and data reading are performed in units of a page. Each block is composed of a plurality of pages.

It should be noted that the form of grouping the nonvolatile memory packages 11a to 11p, 12a to 12p, 13a to 13p, 14a to 14p, 15a to 15p, 16a to 16p, 17a to 17p, and 18a to 18p into the plurality of nonvolatile memory groups 11 to 18 is not limited to the form exemplified by FIGS. 2A to 2F, but may be set in an arbitrary form in consideration of the supply load of the power supply voltage VDD or the like.

According to the memory system 1, when it is started up, an electric power is applied to each of the nonvolatile memory groups 11 to 18. At this time, if a power supply voltage (such as the power supply voltage VDD) is supplied simultaneously to the respective chips of the nonvolatile memory groups 11 to 18, a peak of electric current (inrush current) may be generated in each of the chips of the nonvolatile memory groups 11 to 18. In this case, the inrush current may flow back to a circuit associated with the power supply voltage VDD, from a node on the power supply voltage VDD side in the chip, and can destroy a device element (such as a transistor) in this circuit. Alternatively, if another power supply voltage (such as the power supply voltage VDD2 shown in FIG. 3) has already been supplied to the respective nonvolatile memory groups 11 to 18, an inrush current, which is generated when the power supply voltage VDD is supplied simultaneously to the respective nonvolatile memory groups 11 to 18, may flow to the other power supply voltage VDD2 side in the same chip. In this case, the inrush current may flow to a circuit associated with the power supply voltage VDD2, and can destroy a device element (such as a transistor) in this circuit.

For example, in order to suppress occurrence of a peak of electric current (inrush current) in each of the chips of the nonvolatile memory groups 11 to 18, it may be considered to set a time difference of application timing of an enable signal that is applied from the controller 4 into the respective chips of the nonvolatile memory groups 11 to 18. In this case, since the time difference type application of a power supply voltage into the respective nonvolatile memory groups 11 to 18 is realized by firmware on the controller 4, it is necessary to wait for a period from the start of supply of a power from the host apparatus HA until the completion of activation of the controller 4, and so it is difficult to swiftly suppress generation of the inrush current. Consequently, this tends to prolong the time period from the start timing of supply of a power from the host apparatus HA until the wakeup of the respective nonvolatile memory groups 11 to 18. Further, in the case that the power supply voltage VDD supplied simultaneously to the respective nonvolatile memory groups 11 to 18 acts as a trigger of occurrence of a peak on the other power supply voltage VDD2 side in the same chip, the method mentioned above cannot suppress peak generation of the inrush current.

Therefore, according to this embodiment, a power application timing control circuit 6 is added between the power supply circuit 5 and the respective nonvolatile memory groups 11 to 18, such that time difference type application of a power supply voltage into the respective nonvolatile memory groups 11 to 18 is realized in a hardware manner, and thereby the speed of operation for suppressing generation of the inrush current can be increased.

As shown in FIG. 2A, the power application timing control circuit 6 may be mounted as a plurality of components (not shown) or as a package (not shown), at positions or a position opposite to the connector CN with the power supply circuit 5 interposed therebetween, on the circuit board PCB0, for example. As shown in FIG. 3, the power application timing control circuit 6 is electrically connected between the power supply circuit 5 and the respective nonvolatile memory groups 11 to 18. The power application timing control circuit 6 supplies a power supply voltage sequentially (with a time difference) to the nonvolatile memory groups 11, 12, 13, 14, 15, 16, 17, and 18, in response to reception of the power supply voltage VDD from the power supply circuit 5. The power application timing control circuit 6 is configured to perform time difference type application of the power supply voltage into the respective nonvolatile memory groups 11 to 18.

Figure 4:
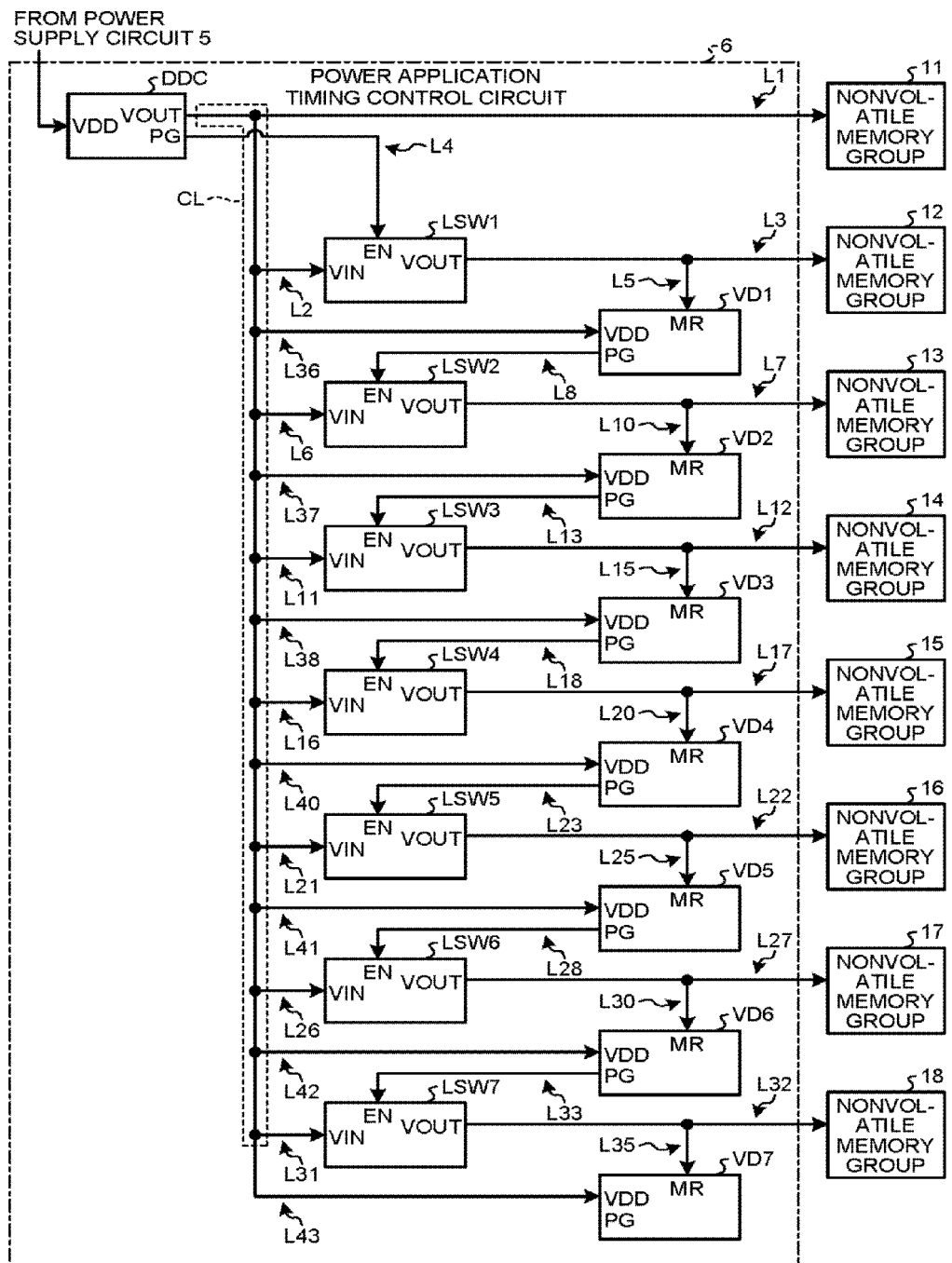
FIG. 4 is a circuit diagram showing a configuration of a power application timing control circuit according to the embodiment.

Specifically, the power application timing control circuit 6 is configured as shown in FIG. 4. FIG. 4 is a circuit diagram showing a configuration of the power application timing control circuit 6.

The power application timing control circuit 6 includes a power supply voltage adjustment circuit DDC, a plurality of load switches LSW1 to LSW7, a plurality of voltage detectors VD1 to VD7, a common line CL, and a plurality of lines L1 to L8, L10 to L13, L15 to L18, L20 to L23, L25 to L28, L30 to L33, L35 to L38, and L40 to L43.

The power supply voltage adjustment circuit DDC is formed of a DC-DC converter, and is configured to operate, in response to reception of the power supply voltage VDD from the power supply circuit 5, to adjust the amplitude of the power supply voltage VDD and output the power supply voltage VDD thus adjusted. The power supply voltage adjustment circuit DDC serves as a power supply voltage adjustment circuit common to the plurality of nonvolatile memory groups 11 to 18, and is configured to output the power supply voltage VDD to be supplied to the plurality of nonvolatile memory groups 11 to 18.

The power supply voltage adjustment circuit DDC includes an output terminal VOUT and a status terminal PG. The output terminal VOUT is a terminal for outputting the power supply voltage VDD. The status terminal PG is a terminal having a level indicating the activation state of the power supply voltage adjustment circuit DDC. The status terminal PG has the ground level (first level) in response to that the power supply voltage adjustment circuit DDC is not started up, and comes to have a high impedance (second level) in response to that the power supply voltage adjustment circuit DDC is started up (i.e., it starts outputting the power supply voltage VDD). The power supply voltage adjustment circuit DDC is configured such that the level of the status terminal PG is shifted from the ground level to the high impedance (to perform a soft start operation) at the timing that a time Ts0 (see FIG. 7) has elapsed since the potential of the output terminal VOUT exceeded a threshold value.

The load switch LSW1 includes an input terminal VIN, an output terminal VOUT, and an enable terminal EN. The load switch LSW1 is kept in the off-state when the enable terminal EN is set in a state at the non-active level (e.g., ground level), and is kept in the on-state when the enable terminal EN is set in a state at the active level (e.g., high impedance). The load switch LSW1 electrically disconnects the input terminal VIN and the output terminal VOUT, in the off-state, and electrically connects the input terminal VIN and the output terminal VOUT, in the on-state.

Figure 5:
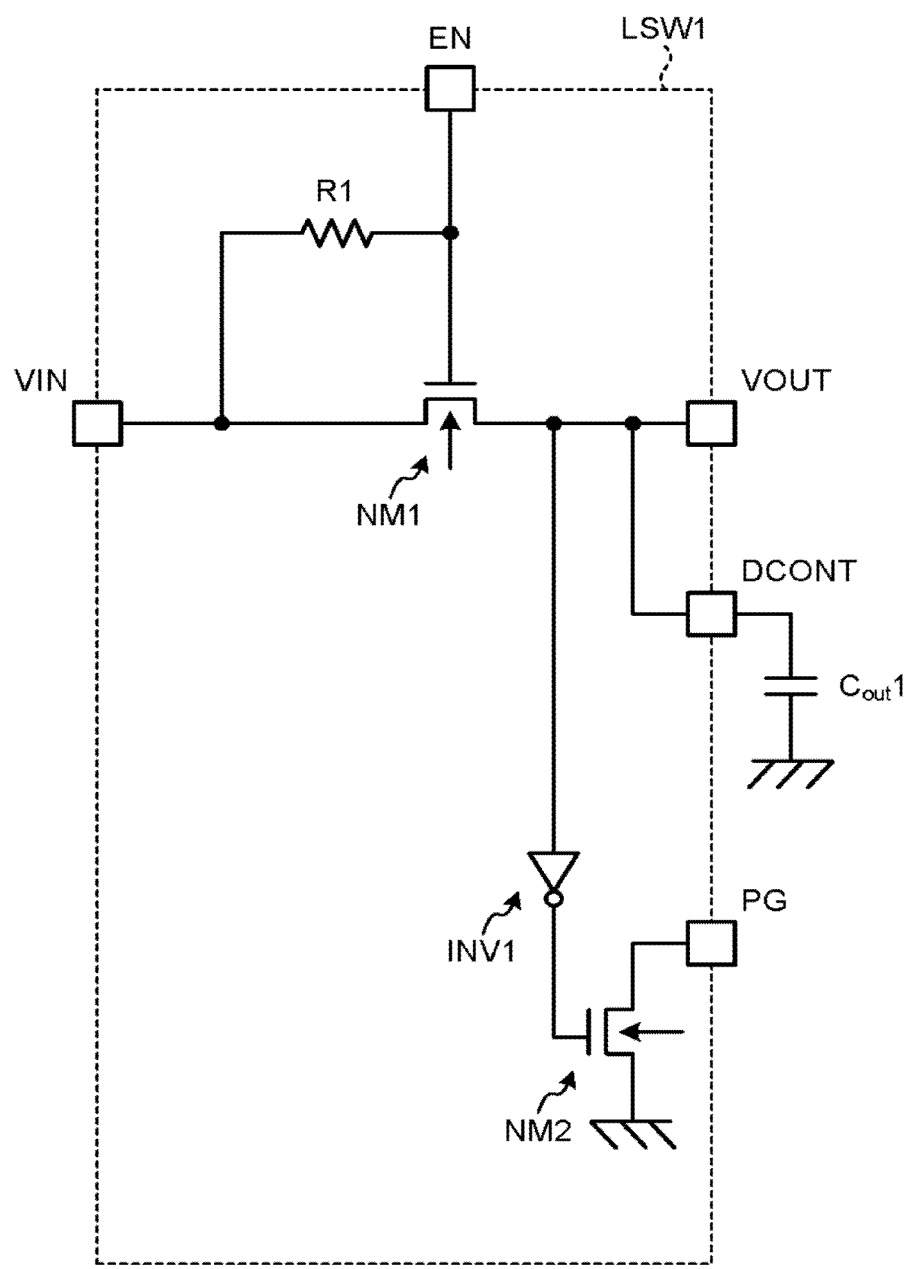
FIG. 5 is a circuit diagram showing a configuration of a load switch according to the embodiment.

More specifically, the load switch LSW1 is configured as shown in FIG. 5. FIG. 5 is a circuit diagram showing a configuration of the load switch LSW1. Here, the configuration shown in FIG. 5 is a mere example, and the load switch LSW1 may be formed to have another configuration, as long as the load switch LSW1 is kept in the off-state when the enable terminal EN is set in a state at the non-active level, and is kept in the on-state when the enable terminal EN is set in a state at the active level. Further, as regards the configuration of the load switch LSW1 exemplified by FIG. 5, the configuration of each of the other load switches LSW2 to LSW7 is the same as that of the load switch LSW1.

The load switch LSW1 includes the input terminal VIN, the output terminal VOUT, the enable terminal EN, a delay amount control terminal DCONT, a status terminal PG, transistors NM1 and NM2, a resistor R1, and an inverter INV1. The transistor NM1 is formed of, for example, an NMOS transistor, in which the gate is electrically connected to the enable terminal EN, the source is electrically connected to the input terminal VIN, and the drain is electrically connected to the output terminal VOUT. The resistor R1 is electrically connected, by its one end, to the input terminal VIN, and is electrically connected, by its other end, to the enable terminal EN. The resistor R1 serves as a pull-up resistor, and is configured to set the gate of the transistor NM1 to an L-level (ground level) when the enable terminal EN is set in a state at the non-active level (ground level), and to pull up the gate of the transistor NM1 to an H-level when the enable terminal EN is set in a state at the active level (high impedance).

The delay amount control terminal DCONT is electrically connected to a node between the drain of the transistor NM1 and the output terminal VOUT. The delay amount control terminal DCONT is configured such that a time Td1 (see FIG. 7), which corresponds to a propagation delay time in the on-state of the load switch LSW1, is adjusted in accordance with the capacitance value of a capacitor element Cout1 externally connected.

The inverter INV1 is electrically connected, by its input side, to a node between the drain of the transistor NM1 and the output terminal VOUT, and is electrically connected, by its output side, to the gate of the transistor NM2. The transistor NM2 is formed of, for example, an NMOS transistor, in which the gate is electrically connected to the output side of the inverter INV1, the source is electrically connected to the ground potential, and the drain is electrically connected to the status terminal PG.

The status terminal PG is a terminal having a level indicating the on/off-state of the load switch LSW1. The status terminal PG has a ground level (fifth level) in response to that the load switch LSW1 is set in the off-state, and comes to have a high impedance (sixth level) in response to that the load switch LSW1 is set in the on-state.

The voltage detector VD1 shown in FIG. 4 includes a power supply terminal VDD, a detection terminal MR, and a status terminal PG. In a state where the power supply terminal VDD is supplied with the power supply voltage VDD, the voltage detector VD1 keeps the status terminal PG at the non-active level (ground level) until a voltage detected by the detection terminal MR exceeds a threshold value, and keeps the status terminal PG at the active level (high impedance) in response to that the voltage detected by the detection terminal MR exceeds the threshold value.

Figure 6:
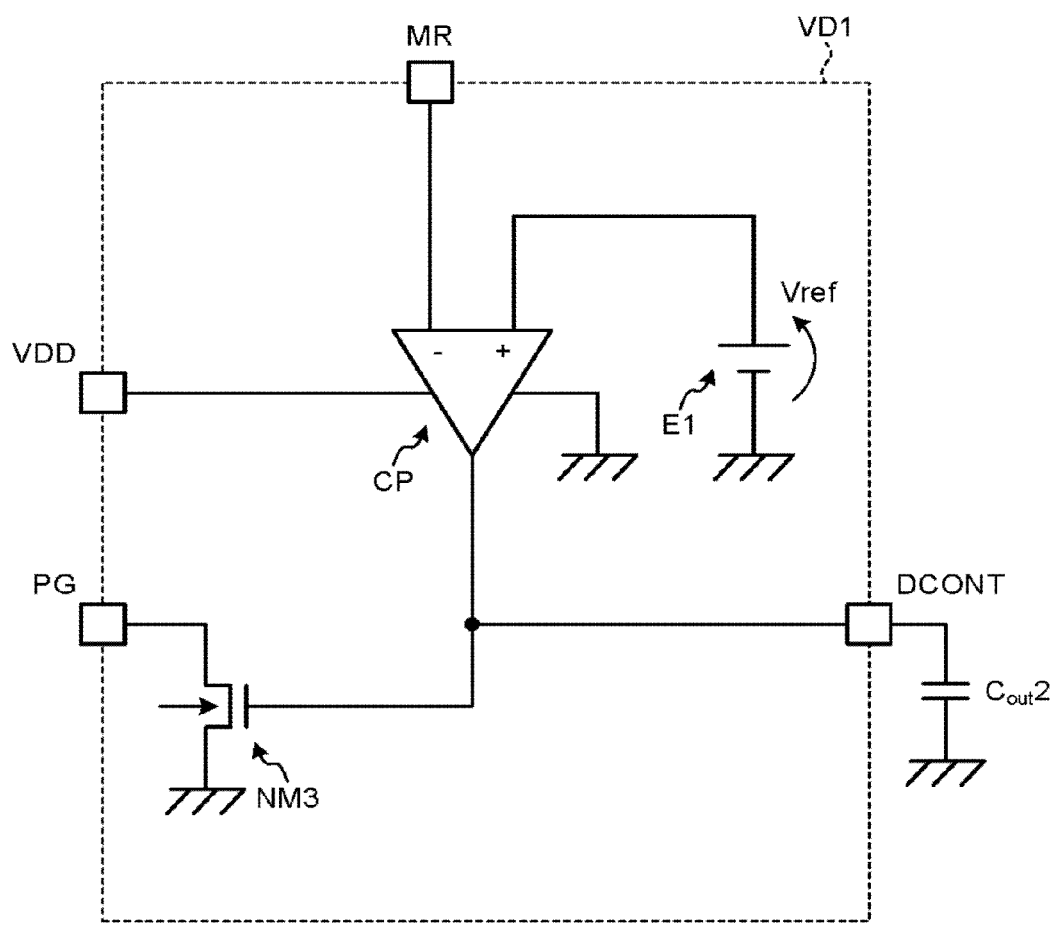
FIG. 6 is a circuit diagram showing a configuration of a voltage detector according to the embodiment.

More specifically, the voltage detector VD1 is configured as shown in FIG. 6. FIG. 6 is a circuit diagram showing a configuration of the voltage detector VD1. Here, the configuration shown in FIG. 6 is a mere example, and the voltage detector VD1 may be formed to have another configuration, as long as the voltage detector VD1 keeps the status terminal PG at the non-active level until a voltage detected by the detection terminal MR exceeds a threshold value, and keeps the status terminal PG at the active level in response to that the voltage detected by the detection terminal MR exceeds the threshold value, in a state where the power supply terminal VDD is supplied with the power supply voltage VDD. Further, as regards the configuration of the voltage detector VD1 exemplified by FIG. 6, the configuration of each of the other voltage detectors VD2 to VD7 is the same as that of the voltage detector VD1.

The voltage detector VD1 includes the power supply terminal VDD, the detection terminal MR, the status terminal PG, a delay amount control terminal DCONT, a comparator CP, a transistor NM3, and a voltage source E1. The comparator CP is configured such that the power supply node is electrically connected to the power supply terminal VDD, the ground node is electrically connected to the ground potential, the inversion input terminal is electrically connected to the detection terminal MR, the non-inversion input terminal is electrically connected to the voltage source E1, and the output terminal is electrically connected to the gate of the transistor NM3. The voltage source E1 is configured to generate a reference voltage Vref and supply it to the comparator CP. The reference voltage Vref is a voltage serving as a threshold value for a voltage to be detected by the voltage detector VD1, and has a level between the potential of the power supply voltage VDD and the ground level.

The delay amount control terminal DCONT is electrically connected to a node between the output terminal of the comparator CP and the gate of the transistor NM3. The delay amount control terminal DCONT is configured such that a time Ts1 (see FIG. 7), which corresponds to a delay time from the timing that a voltage detected by the detection terminal MR exceeds the threshold value until the timing that the level of the status terminal PG is shifted, is adjusted in accordance with the capacitance value of a capacitor element Cout2 externally connected.

The transistor NM3 is formed of, for example, an NMOS transistor, in which the gate is electrically connected to the output terminal of the comparator CP, the source is electrically connected to the ground potential, and the drain is electrically connected to the status terminal PG.

The status terminal PG is a terminal having a level indicating the detection result of the voltage detector VD1. The status terminal PG has the ground level (third level) in response to that a voltage detected by the detection terminal MR does not exceed the threshold value, and comes to have a high impedance (fourth level) in response to that the voltage detected by the detection terminal MR exceeds the threshold value.

The common line CL shown in FIG. 4 is connected, by its one end, to the output terminal VOUT of the power supply voltage adjustment circuit DDC.

The line L1 is electrically connected, by its one end, to the output terminal VOUT of the power supply voltage adjustment circuit DDC via the common line CL, and is electrically connected, by its other end, to the nonvolatile memory group 11. Accordingly, the line L1 electrically connects the output terminal VOUT of the power supply voltage adjustment circuit DDC ($1^{st}$ terminal) to the nonvolatile memory group 11 ($1^{st}$ memory group).

The line L2 is electrically connected, by its one end, to the output terminal VOUT of the power supply voltage adjustment circuit DDC via the common line CL, and is electrically connected, by its other end, to the input terminal VIN of the load switch LSW1. Accordingly, the line L1 electrically connects the output terminal VOUT of the power supply voltage adjustment circuit DDC ($1^{st}$ terminal) to the input terminal VIN of the load switch LSW1 ($3^{rd}$ terminal).

The line L3 is electrically connected, by its one end, to the output terminal VOUT of the load switch LSW1, and is electrically connected, by its other end, to the nonvolatile memory group 12. Accordingly, the line L3 electrically connects the output terminal VOUT of the load switch LSW1 ($4^{th}$ terminal) to the nonvolatile memory group 12 ($2^{nd}$ memory group).

The line L4 is electrically connected, by its one end, to the status terminal PG of the power supply voltage adjustment circuit DDC, and is electrically connected, by its other end, to the enable terminal EN of the load switch LSW1. Accordingly, the line L4 electrically connects the status terminal PG of the power supply voltage adjustment circuit DDC ($2^{nd}$ terminal) to the enable terminal EN of the load switch LSW1 ($5^{th}$ terminal).

The line L5 is electrically connected, by its one end, to the line L3, and is electrically connected, by its other end, to the detection terminal MR of the voltage detector VD1. Accordingly, the line L5 electrically connects the line L3 to the detection terminal MR of the voltage detector VD1 ($6^{th}$ terminal).

The line L6 is electrically connected, by its one end, to the output terminal VOUT of the power supply voltage adjustment circuit DDC via the common line CL, and is electrically connected, by its other end, to the input terminal VIN of the load switch LSW2. Accordingly, the line L6 electrically connects the output terminal VOUT of the power supply voltage adjustment circuit DDC ($1^{st}$ terminal) to the input terminal VIN of the load switch LSW2 ($8^{th}$ terminal).

The line L7 is electrically connected, by its one end, to the output terminal VOUT of the load switch LSW2, and is electrically connected, by its other end, to the nonvolatile memory group 13. Accordingly, the line L7 electrically connects the output terminal VOUT of the load switch LSW2 (ninth terminal) to the nonvolatile memory group 13 ($3^{rd}$ memory group).

The line L8 is electrically connected, by its one end, to the status terminal PG of the voltage detector VD1, and is electrically connected, by its other end, to the enable terminal EN of the load switch LSW2. Accordingly, the line L8 electrically connects the status terminal PG of the voltage detector VD1 ($7^{th}$ terminal) to the enable terminal EN of the load switch LSW2 ($10^{th}$ terminal).

The line L10 is electrically connected, by its one end, to the line L7, and is electrically connected, by its other end, to the detection terminal MR of the voltage detector VD2.

Accordingly, the line L10 electrically connects the line L7 to the detection terminal MR of the voltage detector VD2 ($12^{th}$ terminal).

The line L11 is electrically connected, by its one end, to the output terminal VOUT of the power supply voltage adjustment circuit DDC via the common line CL, and is electrically connected, by its other end, to the input terminal VIN of the load switch LSW3. Accordingly, the line L11 electrically connects the output terminal VOUT of the power supply voltage adjustment circuit DDC ($1^{st}$ terminal) to the input terminal VIN of the load switch LSW3 ($14^{th}$ terminal).

The line L12 is electrically connected, by its one end, to the output terminal VOUT of the load switch LSW3, and is electrically connected, by its other end, to the nonvolatile memory group 14. Accordingly, the line L12 electrically connects the output terminal VOUT of the load switch LSW3 ($15^{th}$ terminal) to the nonvolatile memory group 14 ($4^{th}$ memory group).

The line L13 is electrically connected, by its one end, to the status terminal PG of the voltage detector VD2, and is electrically connected, by its other end, to the enable terminal EN of the load switch LSW3. Accordingly, the line L13 electrically connects the status terminal PG of the voltage detector VD2 ($13^{th}$ terminal) to the enable terminal EN of the load switch LSW3 ($16^{th}$ terminal).

The line L15 is electrically connected, by its one end, to the line L12, and is electrically connected, by its other end, to the detection terminal MR of the voltage detector VD3. Accordingly, the line L15 electrically connects the line L12 to the detection terminal MR of the voltage detector VD3.

The line L16 is electrically connected, by its one end, to the output terminal VOUT of the power supply voltage adjustment circuit DDC via the common line CL, and is electrically connected, by its other end, to the input terminal VIN of the load switch LSW4. Accordingly, the line L16 electrically connects the output terminal VOUT of the power supply voltage adjustment circuit DDC to the input terminal VIN of the load switch LSW4.

The line L17 is electrically connected, by its one end, to the output terminal VOUT of the load switch LSW4, and is electrically connected, by its other end, to the nonvolatile memory group 15. Accordingly, the line L17 electrically connects the output terminal VOUT of the load switch LSW4 to the nonvolatile memory group 15.

The line L18 is electrically connected, by its one end, to the status terminal PG of the voltage detector VD3, and is electrically connected, by its other end, to the enable terminal EN of the load switch LSW4. Accordingly, the line L18 electrically connects the status terminal PG of the voltage detector VD3 to the enable terminal EN of the load switch LSW4.

The line L20 is electrically connected, by its one end, to the line L17, and is electrically connected, by its other end, to the detection terminal MR of the voltage detector VD4. Accordingly, the line L20 electrically connects the line L17 to the detection terminal MR of the voltage detector VD4.

The line L21 is electrically connected, by its one end, to the output terminal VOUT of the power supply voltage adjustment circuit DDC via the common line CL, and is electrically connected, by its other end, to the input terminal VIN of the load switch LSW5. Accordingly, the line L21 electrically connects the output terminal VOUT of the power supply voltage adjustment circuit DDC to the input terminal VIN of the load switch LSW5.

The line L22 is electrically connected, by its one end, to the output terminal VOUT of the load switch LSW5, and is electrically connected, by its other end, to the nonvolatile memory group 16. Accordingly, the line L22 electrically connects the output terminal VOUT of the load switch LSW5 to the nonvolatile memory group 16.

The line L23 is electrically connected, by its one end, to the status terminal PG of the voltage detector VD4, and is electrically connected, by its other end, to the enable terminal EN of the load switch LSW5. Accordingly, the line L23 electrically connects the status terminal PG of the voltage detector VD4 to the enable terminal EN of the load switch LSW5.

The line L25 is electrically connected, by its one end, to the line L22, and is electrically connected, by its other end, to the detection terminal MR of the voltage detector VD5. Accordingly, the line L25 electrically connects the line L22 to the detection terminal MR of the voltage detector VD5.

The line L26 is electrically connected, by its one end, to the output terminal VOUT of the power supply voltage adjustment circuit DDC via the common line CL, and is electrically connected, by its other end, to the input terminal VIN of the load switch LSW6. Accordingly, the line L26 electrically connects the output terminal VOUT of the power supply voltage adjustment circuit DDC to the input terminal VIN of the load switch LSW6.

The line L27 is electrically connected, by its one end, to the output terminal VOUT of the load switch LSW6, and is electrically connected, by its other end, to the nonvolatile memory group 17. Accordingly, the line L27 electrically connects the output terminal VOUT of the load switch LSW6 to the nonvolatile memory group 17.

The line L28 is electrically connected, by its one end, to the status terminal PG of the voltage detector VD5, and is electrically connected, by its other end, to the enable terminal EN of the load switch LSW5. Accordingly, the line L28 electrically connects the status terminal PG of the voltage detector VD5 to the enable terminal EN of the load switch LSW5.

The line L30 is electrically connected, by its one end, to the line L27, and is electrically connected, by its other end, to the detection terminal MR of the voltage detector VD6. Accordingly, the line L30 electrically connects the line L27 to the detection terminal MR of the voltage detector VD6.

The line L31 is electrically connected, by its one end, to the output terminal VOUT of the power supply voltage adjustment circuit DDC via the common line CL, and is electrically connected, by its other end, to the input terminal VIN of the load switch LSW7. Accordingly, the line L31 electrically connects the output terminal VOUT of the power supply voltage adjustment circuit DDC to the input terminal VIN of the load switch LSW7.

The line L32 is electrically connected, by its one end, to the output terminal VOUT of the load switch LSW7, and is electrically connected, by its other end, to the nonvolatile memory group 18. Accordingly, the line L32 electrically connects the output terminal VOUT of the load switch LSW7 to the nonvolatile memory group 18.

The line L33 is electrically connected, by its one end, to the status terminal PG of the voltage detector VD6, and is electrically connected, by its other end, to the enable terminal EN of the load switch LSW7. Accordingly, the line L33 electrically connects the status terminal PG of the voltage detector VD6 to the enable terminal EN of the load switch LSW7.

The line L35 is electrically connected, by its one end, to the line L32, and is electrically connected, by its other end, to the detection terminal MR of the voltage detector VD7. Accordingly, the line L35 electrically connects the line L32 to the detection terminal MR of the voltage detector VD7.

The line L36 is electrically connected, by its one end, to the output terminal VOUT of the power supply voltage adjustment circuit DDC via the common line CL, and is electrically connected, by its other end, to the power supply terminal VDD of the voltage detector VD1. Accordingly, the line L36 electrically connects the output terminal VOUT of the power supply voltage adjustment circuit DDC to the power supply terminal VDD of the voltage detector VD1.

The line L37 is electrically connected, by its one end, to the output terminal VOUT of the power supply voltage adjustment circuit DDC via the common line CL, and is electrically connected, by its other end, to the power supply terminal VDD of the voltage detector VD2. Accordingly, the line L37 electrically connects the output terminal VOUT of the power supply voltage adjustment circuit DDC to the power supply terminal VDD of the voltage detector VD2.

The line L38 is electrically connected, by its one end, to the output terminal VOUT of the power supply voltage adjustment circuit DDC via the common line CL, and is electrically connected, by its other end, to the power supply terminal VDD of the voltage detector VD3. Accordingly, the line L38 electrically connects the output terminal VOUT of the power supply voltage adjustment circuit DDC to the power supply terminal VDD of the voltage detector VD3.

The line L40 is electrically connected, by its one end, to the output terminal VOUT of the power supply voltage adjustment circuit DDC via the common line CL, and is electrically connected, by its other end, to the power supply terminal VDD of the voltage detector VD4. Accordingly, the line L40 electrically connects the output terminal VOUT of the power supply voltage adjustment circuit DDC to the power supply terminal VDD of the voltage detector VD4.

The line L41 is electrically connected, by its one end, to the output terminal VOUT of the power supply voltage adjustment circuit DDC via the common line CL, and is electrically connected, by its other end, to the power supply terminal VDD of the voltage detector VD5. Accordingly, the line L41 electrically connects the output terminal VOUT of the power supply voltage adjustment circuit DDC to the power supply terminal VDD of the voltage detector VD5.

The line L42 is electrically connected, by its one end, to the output terminal VOUT of the power supply voltage adjustment circuit DDC via the common line CL, and is electrically connected, by its other end, to the power supply terminal VDD of the voltage detector VD6. Accordingly, the line L42 electrically connects the output terminal VOUT of the power supply voltage adjustment circuit DDC to the power supply terminal VDD of the voltage detector VD6.

The line L43 is electrically connected, by its one end, to the output terminal VOUT of the power supply voltage adjustment circuit DDC via the common line CL, and is electrically connected, by its other end, to the power supply terminal VDD of the voltage detector VD7. Accordingly, the line L43 electrically connects the output terminal VOUT of the power supply voltage adjustment circuit DDC to the power supply terminal VDD of the voltage detector VD7.

Next, an explanation will be given of an operation of the power application timing control circuit 6. As shown in FIG. 4, the plurality of load switches LSW1 to LSW7 of the power application timing control circuit 6 correspond to the plurality of nonvolatile memory groups 11 to 18. In an initial state, the connections between the power supply voltage adjustment circuit DDC and the respective nonvolatile memory groups 11 to 18 are electrically disconnected by the corresponding load switches LSW1 to LSW7.

The plurality of voltage detectors VD1 to VD7 of the power application timing control circuit 6 correspond to the plurality of load switches LSW1 to LSW7. The outputs of the load switches LSW1 are monitored by the corresponding voltage detectors VD1 to VD7.

When the power supply voltage VDD is supplied by the power supply circuit 5 to the power supply voltage adjustment circuit DDC, and the power supply voltage adjustment circuit DDC is started up, the power supply voltage VDD output from the power supply voltage adjustment circuit DDC can be input almost simultaneously to all of the load switches LSW1 to LSW7 and the voltage detectors VD1 to VD7.

In the power application timing control circuit 6, the monitored results obtained by the voltage detectors VD1 to VD6 (the levels of the status terminals PG) are transmitted to the enable terminals EN of the next-stage load switches LSW2 to LSW7 so that power applications to the respective nonvolatile memory groups 11 to 18 can be sequentially performed in a relay manner.

Figure 7:
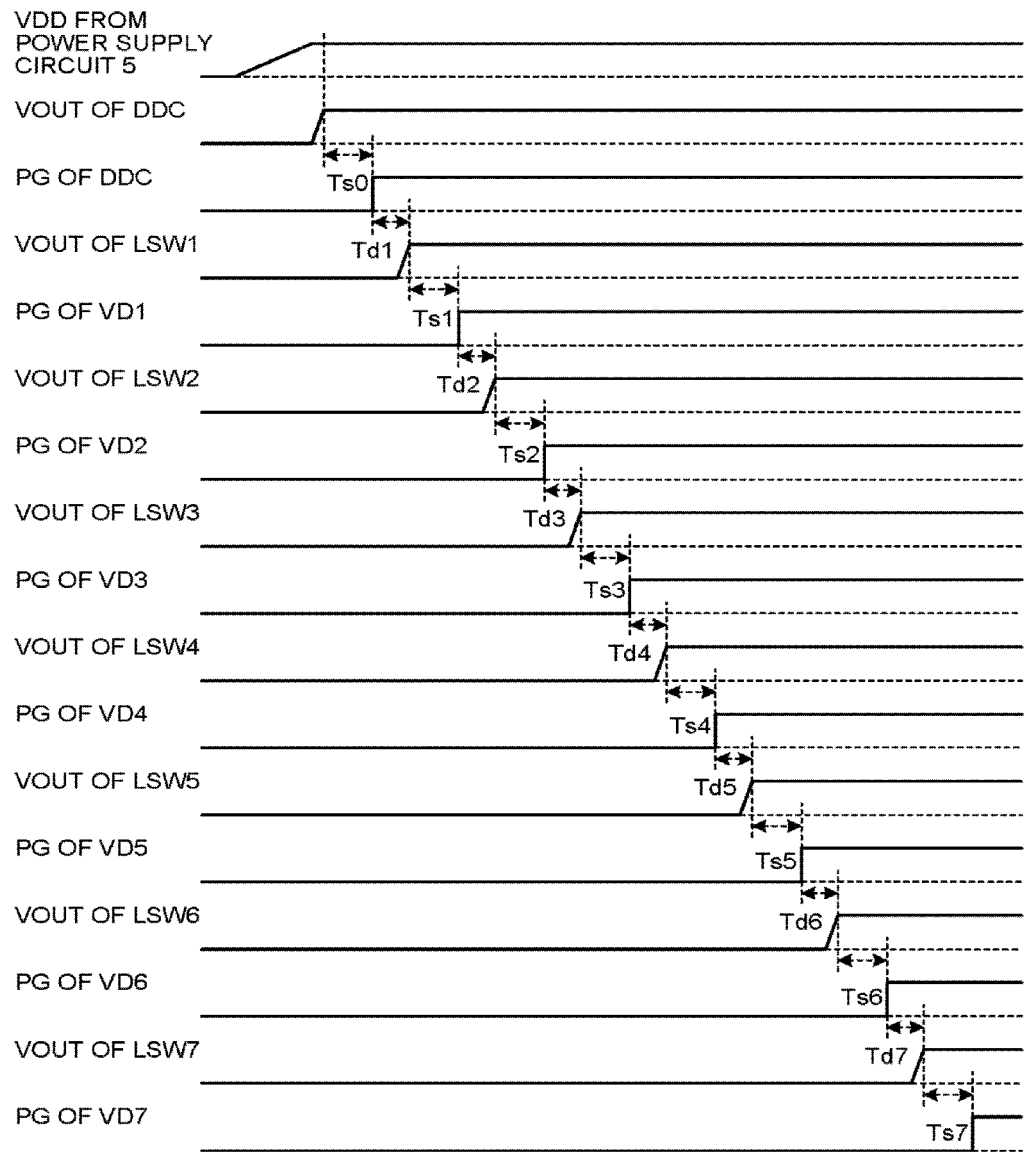
FIG. 7 is a waveform chart showing an operation of the power application timing control circuit according to the embodiment.

For example, the power application timing control circuit 6 performs an operation as shown in FIG. 7. FIG. 7 is a waveform chart showing an operation of the power application timing control circuit 6. In the waveform chart shown in FIG. 7, a high impedance is shown by use of an H-level waveform, for the sake of convenience in illustration.

Upon detecting that the power supply voltage VDD is supplied from the power supply circuit 5, the power supply voltage adjustment circuit DDC outputs an power supply voltage VDD corresponding to it from the output terminal VOUT. Consequently, the potential of the line L1 rises from the ground level to the H-level (VDD level).

Along with this, the power supply voltage adjustment circuit DDC performs a soft start operation. Specifically, the power supply voltage adjustment circuit DDC shifts the level of the status terminal PG from the ground level to the high impedance at the timing that a time Ts0 has elapsed since the potential of the output terminal VOUT exceeded the threshold value. The level of the status terminal PG of the power supply voltage adjustment circuit DDC is transmitted via the line L4 to the enable terminal EN of the load switch LSW1.

The load switch LSW1 is turned on at the timing that a time Td1 has elapsed since the timing that the level of the status terminal PG of the power supply voltage adjustment circuit DDC was shifted to the high impedance. Consequently, the potential of the output terminal VOUT of the load switch LSW1 rises from the ground level to the H-level (VDD level), and the potential of the line L3 rises from the ground level to the H-level (VDD level).

Upon detecting that the potential of the line L3 exceeds the threshold value (reference voltage Vref), the voltage detector VD1 shifts the level of the status terminal PG from the ground level to the high impedance at the timing that a time Ts1 has elapsed since this detection timing. The level of the status terminal PG of the voltage detector VD1 is transmitted via the line L8 to the enable terminal EN of the load switch LSW2.

The load switch LSW2 is turned on at the timing that a time Td2 has elapsed since the timing that the level of the status terminal PG of the voltage detector VD1 was shifted to the high impedance. Consequently, the potential of the output terminal VOUT of the load switch LSW2 rises from the ground level to the H-level (VDD level), and the potential of the line L7 rises from the ground level to the H-level (VDD level).

Upon detecting that the potential of the line L7 exceeds the threshold value (reference voltage Vref), the voltage detector VD2 shifts the level of the status terminal PG from the ground level to the high impedance at the timing that a time Ts2 has elapsed since this detection timing. The level of the status terminal PG of the voltage detector VD2 is transmitted via the line L13 to the enable terminal EN of the load switch LSW3.

The load switch LSW3 is turned on at the timing that a time Td3 has elapsed since the timing that the level of the status terminal PG of the voltage detector VD2 was shifted to the high impedance. Consequently, the potential of the output terminal VOUT of the load switch LSW3 rises from the ground level to the H-level (VDD level), and the potential of the line L12 rises from the ground level to the H-level (VDD level).

Upon detecting that the potential of the line L12 exceeds the threshold value (reference voltage Vref), the voltage detector VD3 shifts the level of the status terminal PG from the ground level to the high impedance at the timing that a time Ts3 has elapsed since this detection timing. The level of the status terminal PG of the voltage detector VD3 is transmitted via the line L18 to the enable terminal EN of the load switch LSW4.

The load switch LSW4 is turned on at the timing that a time Td4 has elapsed since the timing that the level of the status terminal PG of the voltage detector VD3 was shifted to the high impedance. Consequently, the potential of the output terminal VOUT of the load switch LSW4 rises from the ground level to the H-level (VDD level), and the potential of the line L17 rises from the ground level to the H-level (VDD level).

Upon detecting that the potential of the line L17 exceeds the threshold value (reference voltage Vref), the voltage detector VD4 shifts the level of the status terminal PG from the ground level to the high impedance at the timing that a time Ts4 has elapsed since this detection timing. The level of the status terminal PG of the voltage detector VD4 is transmitted via the line L23 to the enable terminal EN of the load switch LSW5.

The load switch LSW5 is turned on at the timing that a time Td5 has elapsed since the timing that the level of the status terminal PG of the voltage detector VD4 was shifted to the high impedance. Consequently, the potential of the output terminal VOUT of the load switch LSW5 rises from the ground level to the H-level (VDD level), and the potential of the line L22 rises from the ground level to the H-level (VDD level).

Upon detecting that the potential of the line L22 exceeds the threshold value (reference voltage Vref), the voltage detector VD5 shifts the level of the status terminal PG from the ground level to the high impedance at the timing that a time Ts5 has elapsed since this detection timing. The level of the status terminal PG of the voltage detector VD5 is transmitted via the line L28 to the enable terminal EN of the load switch LSW6.

The load switch LSW6 is turned on at the timing that a time Td6 has elapsed since the timing that the level of the status terminal PG of the voltage detector VD5 was shifted to the high impedance. Consequently, the potential of the output terminal VOUT of the load switch LSW6 rises from the ground level to the H-level (VDD level), and the potential of the line L27 rises from the ground level to the H-level (VDD level).

Upon detecting that the potential of the line L27 exceeds the threshold value (reference voltage Vref), the voltage detector VD6 shifts the level of the status terminal PG from the ground level to the high impedance at the timing that a time Ts6 has elapsed since this detection timing. The level of the status terminal PG of the voltage detector VD6 is transmitted via the line L33 to the enable terminal EN of the load switch LSW7.

The load switch LSW7 is turned on at the timing that a time Td7 has elapsed since the timing that the level of the status terminal PG of the voltage detector VD6 was shifted to the high impedance. Consequently, the potential of the output terminal VOUT of the load switch LSW7 rises from the ground level to the H-level (VDD level), and the potential of the line L32 rises from the ground level to the H-level (VDD level).

Upon detecting that the potential of the line L32 exceeds the threshold value (reference voltage Vref), the voltage detector VD7 shifts the level of the status terminal PG from the ground level to the high impedance at the timing that a time Ts7 has elapsed since this detection timing.

When the status terminal PG of the last-stage voltage detector VD7 is shifted to the high impedance, the write inhibition state with respect to all the nonvolatile memory groups 11 to 18 is cancelled.

As described above, according to this embodiment, the power application timing control circuit 6 is interposed between the power supply circuit 5 and the respective nonvolatile memory groups 11 to 18. For example, the power application timing control circuit 6 is configured such that the load switches LSW1 to LSW7 are disposed between the power supply voltage adjustment circuit DDC and the respective nonvolatile memory groups 12 to 18, and the load switches LSW1 to LSW7 are set in the off-state in the initial state. Further, it is configured such that the level of the status terminal of the power supply voltage adjustment circuit DDC is transmitted to the enable terminal of the first-stage load switch LSW1. Furthermore, it is configured such that the voltages of the lines connected to the output terminals of the load switches LSW1 to LSW6 can be detected by the voltage detectors VD1 to VD6, and the detection results (the levels of the status terminals) of the voltage detectors VD1 to VD6 are transmitted to the enable terminals of the next-stage load switches LSW2 to LSW7. Consequently, time difference type application of a power supply voltage into the respective nonvolatile memory groups 11 to 18 is realized in a hardware manner, and thereby the speed of suppressing generation of the inrush current can be increased. As a result, it is possible to shorten the time period from the start timing of supply of a power from the host apparatus HA until the wakeup of the respective nonvolatile memory groups 11 to 18, as compared with a case where the time difference type application of a power supply voltage into the respective nonvolatile memory groups 11 to 18 is realized by firmware on the controller 4.

Further, according to this embodiment, since the timing shift is set in terms of voltage application itself into the respective nonvolatile memory groups 11 to 18 by use of the power application timing control circuit 6, it is possible to address a case that cannot be controlled by firmware.

Here, it is tentatively assumed that, in the configuration shown in FIG. 4, a load switch is electrically inserted on the line L1, and a voltage detector is added to detect the potential of a node between the output terminal of this load switch and the nonvolatile memory group 11. In this case, the configuration is altered such that the level of the status terminal of the power supply voltage adjustment circuit DDC is transmitted to the enable terminal of the load switch on the line L1, and the level of the status terminal of the added voltage detector is transmitted to the enable terminal of the load switch LSW1. Consequently, the power application timing into the nonvolatile memory group 11, which is supplied with a power at first among the plurality of nonvolatile memory groups 11 to 18, is delayed relative to the output start timing of the power supply voltage VDD from the power supply voltage adjustment circuit DDC. In this case, it may become difficult to increase the speed of suppressing generation of the inrush current.

On the other hand, according to this embodiment, the power supply voltage adjustment circuit DDC is electrically connected to the nonvolatile memory group 11 via the common line CL and the line L1 without any load switch interposed therebetween. Consequently, the power application timing into the nonvolatile memory group 11, which is supplied with a power at first among the plurality of nonvolatile memory groups 11 to 18, can be set almost simultaneously with the output start timing of the power supply voltage VDD from the power supply voltage adjustment circuit DDC, and thereby it becomes easier to increase the speed of suppressing generation of the inrush current.

It should be noted that the concrete mounting form of the power application timing control circuit 6 is not limited to the form shown in FIG. 2A, but may be selected from various mounting forms as long as time difference type application of a power supply voltage into the respective nonvolatile memory groups 11 to 18 is realized in a hardware manner. The power application timing control circuit 6 may be designed such that its part corresponding to the respective nonvolatile memory groups 11 to 18 is divided into circuit blocks, and the divisional circuit blocks are disposed near the corresponding nonvolatile memory groups 11 to 18 (see FIGS. 2A to 2F). For example, in the power application timing control circuit 6 shown in FIG. 4, a divisional part including the load switch LSW1, the lines L3 and L5, and the voltage detector VD1 may be formed as a circuit block and disposed near the nonvolatile memory group 12; . . . ; and a divisional part including the load switch LSW7, the lines L32 and L35, and the voltage detector VD7 may be formed as a circuit block and disposed near the nonvolatile memory group 18. In this case, for example, by use of the design that the lines from the respective load switches LSW1 to LSW8 to the corresponding nonvolatile memory groups 11 to 18 are set to have the same length, or the like, the time periods from the timing that the respective load switches LSW1 to LSW8 are turned on until the power supply voltage VDD is transmitted to the nonvolatile memory groups 11 to 18 can be set substantially equal to each other. As a result, time difference type application of a power supply voltage into the respective nonvolatile memory groups 11 to 18 can be performed with high accuracy.

Further, FIG. 7 shows as an example a case that the propagation delay times in the on-state of the respective load switches LSW1 to LSW7 are equal to each other (Td1=Td2=Td3=Td4=Td5=Td6=Td7=Tref1), but a different propagation delay time may be mixed in the propagation delay times of the respective load switches LSW1 to LSW7. Similarly, FIG. 7 shows as an example a case that the delay times of the respective voltage detectors VD1 to VD7 are equal to each other (Ts1=Ts2=Ts3=Ts4=Ts5=Ts6=Ts7=Tref2), but a different propagation delay time may be mixed in the propagation delay times of the respective voltage detectors VD1 to VD7.

For example, the total delay time obtained from the propagation delay time of a load switch and the delay time of a voltage detector may be designed such that the total delay time is set shorter for when the number of nonvolatile memory groups in the on-operation state is smaller, and the total delay time is gradually increased in accordance with an increase in the number of nonvolatile memory groups in the on-operation state (Td1+Ts1<Td2+Ts2<Td3+Ts3<Td4+Ts4<Td5+Ts5<Td6+Ts6<Td7+Ts7=Tref1+Tref2). Consequently, the occurrence of a peak of electric current can be reliably suppressed in accordance with an increase in the number of nonvolatile memory groups in the on-operation state while the delay time is shortened as a whole, and thereby the speed of suppressing generation of the inrush current can be further increased.

Further, the status terminal PG of the power supply voltage adjustment circuit DDC may be designed to be at the H-level instead of the high impedance in response to that the power supply voltage adjustment circuit DDC is started up. In this case, the configuration of the load switch LSW1 shown in FIG. 5 may be altered such that the resistor R1 serving as a pull-up resistor is omitted. Similarly, the status terminal PG of each of the voltage detectors VD1 to VD6 may be designed to be at the H-level instead of the high impedance in response to that the potential detected by the detection terminal MR exceeds the threshold value (reference voltage Vref). In this case, the configuration of each of the load switches LSW2 to LSW7 (see FIG. 5) may be altered such that the resistor R1 serving as a pull-up resistor is omitted.

Figure 8:
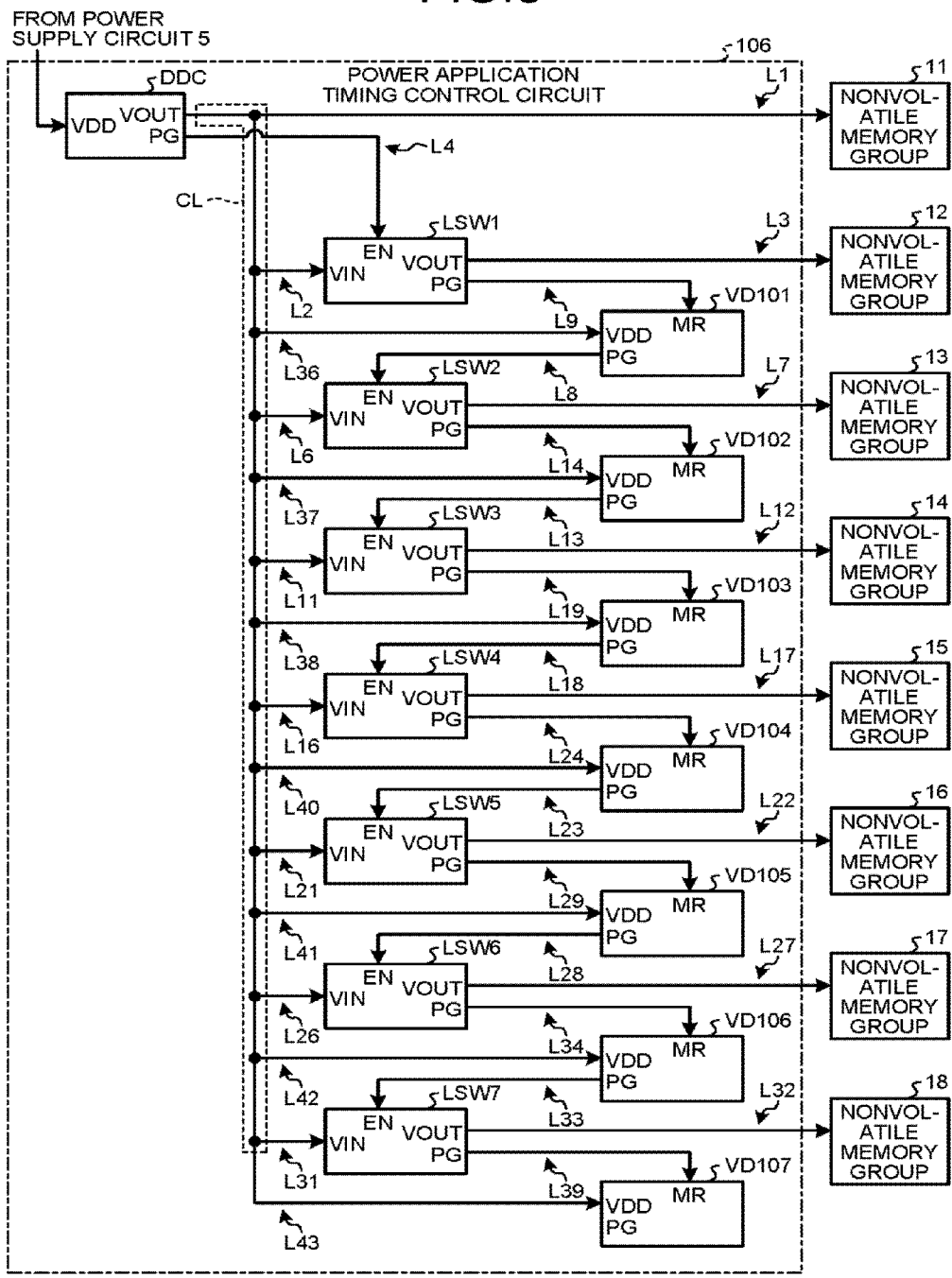
FIG. 8 is a circuit diagram showing a configuration of a power application timing control circuit according to a modification of the embodiment.

Further, as shown in FIG. 8, the power application timing control circuit 106 may be designed such that each of the voltage detectors VD101 to VD107 is configured to detect the level of the status terminal PG of the corresponding one of the load switches LSW1 to LSW7 instead of the potential of the output side line of the corresponding one of the load switches LSW1 to LSW7. Specifically, the power application timing control circuit 106 includes voltage detectors VD101 to VD107 in place of the voltage detectors VD1 to VD7 (see FIG. 4), and includes lines L9, L14, L19, L24, L29, L34, and L39 in place of the lines L5, L10, L15, L20, L25, L30, and L35 (see FIG. 4).

For example, the status terminal PG of the load switch LSW1 is a terminal having a level indicating the on/off-state of the load switch LSW1. The status terminal PG has the ground level (fifth level) in response to that the load switch LSW1 is set in the off-state, and comes to have a high impedance (sixth level) in response to that the load switch LSW1 is set in the on-state.

Figure 9:
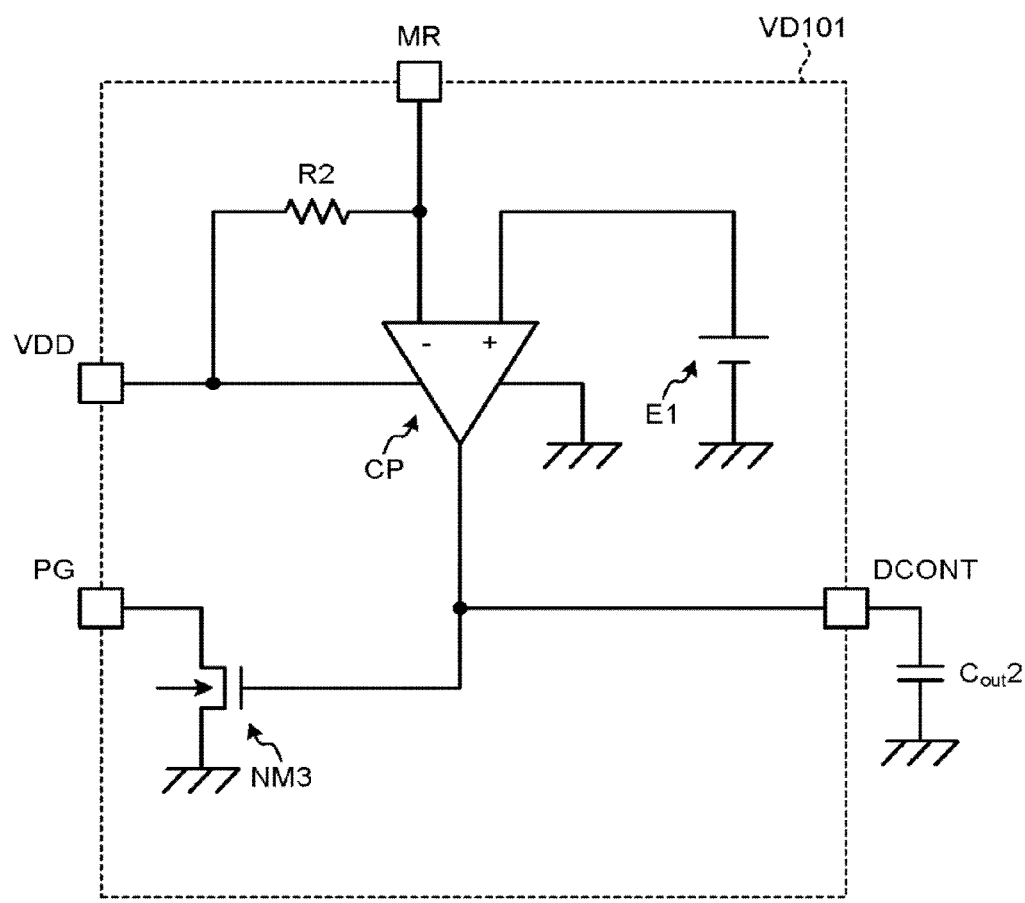
FIG. 9 is a circuit diagram showing a configuration of a voltage detector according to the embodiment.

In accordance with this, the voltage detector VD101 may have a configuration such that a resistor R2 is added to the configuration of the voltage detector VD1 (see FIG. 6). FIG. 9 is a circuit diagram showing a configuration of the voltage detector VD101. Here, as regards the configuration of the voltage detector VD101 exemplified by FIG. 9, the configuration of each of the other voltage detectors VD102 to VD107 is the same as that of the voltage detector VD101.

The resistor R2 is electrically connected, by its one end, to the power supply terminal VDD, and is electrically connected, by its other end, to the detection terminal MR. The resistor R2 serves as a pull-up resistor, and is configured to set the inversion input terminal of the comparator CP to an L-level (ground level) when the detection terminal MR is set in a state at the non-active level (ground level), and to pull up the inversion input terminal of the comparator CP to an H-level when the detection terminal MR is set in a state at the active level (high impedance).

The line L9 shown in FIG. 8 is electrically connected, by its one end, to the status terminal PG of the load switch LSW1, and is electrically connected, by its other end, to the detection terminal MR of the voltage detector VD101.

Accordingly, the line L9 electrically connects the status terminal PG of the load switch LSW1 (11th terminal) to the detection terminal MR of the voltage detector VD101 ($6^{th}$ terminal).

The line L14 is electrically connected, by its one end, to the status terminal PG of the load switch LSW2, and is electrically connected, by its other end, to the detection terminal MR of the voltage detector VD102. Accordingly, the line L14 electrically connects the status terminal PG of the load switch LSW2 (17th terminal) to the detection terminal MR of the voltage detector VD102 (12th terminal).

The line L19 is electrically connected, by its one end, to the status terminal PG of the load switch LSW3, and is electrically connected, by its other end, to the detection terminal MR of the voltage detector VD103. Accordingly, the line L19 electrically connects the status terminal PG of the load switch LSW3 to the detection terminal MR of the voltage detector VD103.

The line L24 is electrically connected, by its one end, to the status terminal PG of the load switch LSW4, and is electrically connected, by its other end, to the detection terminal MR of the voltage detector VD104. Accordingly, the line L24 electrically connects the status terminal PG of the load switch LSW4 to the detection terminal MR of the voltage detector VD104.

The line L29 is electrically connected, by its one end, to the status terminal PG of the load switch LSW5, and is electrically connected, by its other end, to the detection terminal MR of the voltage detector VD105. Accordingly, the line L29 electrically connects the status terminal PG of the load switch LSW5 to the detection terminal MR of the voltage detector VD105.

The line L34 is electrically connected, by its one end, to the status terminal PG of the load switch LSW6, and is electrically connected, by its other end, to the detection terminal MR of the voltage detector VD106. Accordingly, the line L34 electrically connects the status terminal PG of the load switch LSW6 to the detection terminal MR of the voltage detector VD106.

The line L39 is electrically connected, by its one end, to the status terminal PG of the load switch LSW7, and is electrically connected, by its other end, to the detection terminal MR of the voltage detector VD107. Accordingly, the line L39 electrically connects the status terminal PG of the load switch LSW7 to the detection terminal MR of the voltage detector VD107.

Also according to this configuration, time difference type application of a power supply voltage into the respective nonvolatile memory groups 11 to 18 is realized in a hardware manner, and thereby the speed of suppressing generation of the inrush current can be increased.

Further, the status terminal PG of each of the load switches LSW1 to LSW7 shown in FIG. 8 may be designed to be at the H-level instead of the high impedance in response to that the load switch is turned on. In this case, each of the voltage detectors VD101 to VD107 may be configured to be the same as the configuration shown in FIG. 6.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a 1st memory group;
a 2nd memory group;
a power supply voltage adjustment circuit including a 1st terminal and a 2nd terminal, a level of the 2nd terminal changing after a level of the 1st terminal is changed;
a 1st line electrically connecting the 1st terminal to the 1st memory group;
a 1st switch including a 3rd terminal, a 4th terminal, and a 5th terminal, the 1st switch electrically connecting the 3rd terminal to the 4th terminal when turned on;
a 2nd line electrically connecting the 1st terminal to the 3rd terminal;
a 3rd line electrically connecting the 4th terminal to the 2nd memory group; and
a 4th line electrically connecting the 2nd terminal to the 5th terminal.

2. The memory system according to claim 1, further comprising:
a 3rd memory group;
a 1st voltage detection circuit including a 6th terminal and a 7th terminal;
a 5th line electrically connecting the 3rd line to the 6th terminal;
a 2nd switch including an 8th terminal, a 9th terminal, and a 10th terminal, the 2nd switch electrically connecting the 8th terminal to the 9th terminal when turned on;
a 6th line electrically connecting the 1st terminal to the 8th terminal;
a 7th line electrically connecting the 9th terminal to the 3rd memory group; and
an 8th line electrically connecting the 7th terminal to the 10th terminal.

3. The memory system according to claim 1, wherein the 1st switch further includes an 11th terminal, and the memory system further comprises:
a 3rd memory group;
a 1st voltage detection circuit including a 6th terminal and a 7th terminal;
a 9th line electrically connecting the 11th terminal to the 6th terminal;
a 2nd switch including an 8th terminal, a 9th terminal, and a 10th terminal, the 2nd switch electrically connecting the 8th terminal to the 9th terminal when turned on;
a 6th line electrically connecting the 1st terminal to the 8th terminal;
a 7th line electrically connecting the 9th terminal to the 3rd memory group; and
an 8th line electrically connecting the 7th terminal to the 10th terminal.

4. The memory system according to claim 2, further comprising:
a 4th memory group;
a 2nd voltage detection circuit including a 12th terminal and a 13th terminal;
a 10th line electrically connecting the 7th line to the 12th terminal;
a 3rd switch including a 14th terminal, a 15th terminal, and a 16th terminal, the 3rd switch electrically connecting the 14th terminal to the 15th terminal when turned on;
an 11th line electrically connecting the 1st terminal to the 14th terminal;

a 12th line electrically connecting the 15th terminal to the 4th memory group; and
a 13th line electrically connecting the 13th terminal to the 16th terminal.

5. The memory system according to claim 3, wherein
the 2nd switch further includes a 17th terminal, and
the memory system further comprises:
a 4th memory group;
a 2nd voltage detection circuit including a 12th terminal and a 13th terminal;
a 14th line electrically connecting the 17th terminal to the 12th terminal;
a 3rd switch including a 14th terminal, a 15th terminal, and a 16th terminal, the 3rd switch electrically connecting the 14th terminal to the 15th terminal when turned on;
an 11th line electrically connecting the 1st terminal to the 14th terminal;
a 12th line electrically connecting the 15th terminal to the 4th memory group; and
a 13th line electrically connecting the 13th terminal to the 16th terminal.

6. The memory system according to claim 1, wherein
the 2nd terminal has a first level in response to that the power supply voltage adjustment circuit is not started up, and has a second level in response to that the power supply voltage adjustment circuit is started up.

7. The memory system according to claim 6, wherein
the 1st switch is kept in an off-state in response to that the 2nd terminal has the first level, and is kept in an on-state in response to that the 2nd terminal has the second level.

8. The memory system according to claim 2, wherein
the 7th terminal has a third level in response to that a potential of the 3rd line does not exceed a threshold value, and has a fourth level in response to that the potential of the 3rd line exceeds the threshold value.

9. The memory system according to claim 8, wherein
the 2nd switch is kept in an off-state in response to that the 7th terminal has the third level, and is kept in an on-state in response to that the 7th terminal has the fourth level.

10. The memory system according to claim 3, wherein
the 11th terminal has a 5th level in response to that the 1st switch is set in an off-state, and has a sixth level in response to that the 1st switch is set in an on-state, and
the 7th terminal has a third level in response to that the 11th terminal has a fifth level, and has a fourth level in response to that the 11th terminal has the sixth level.

11. The memory system according to claim 10, wherein
the 2nd switch is kept in an off-state in response to that the 7th terminal has the third level, and is kept in an on-state in response to that the 7th terminal has the fourth level.

12. The memory system according to claim 4, wherein
the 13th terminal has a seventh level in response to that a potential of the 7th line does not exceed a threshold value, and has an eighth level in response to that the potential of the 7th line exceeds the threshold value.

13. The memory system according to claim 12, wherein
the 3rd switch is kept in an off-state in response to that the 13th terminal has the seventh level, and is kept in an on-state in response to that the 13th terminal has the eighth level.

14. The memory system according to claim 5, wherein
the 17th terminal has a ninth level in response to that the 2nd switch is set in an off-state, and has a tenth level in response to that the 2nd switch is set in an on-state, and
the 13th terminal has a seventh level in response to that the 17th terminal has the ninth level, and has an eighth level in response to that the 17th terminal has the tenth level.

15. The memory system according to claim 14, wherein
the 3rd switch is kept in an off-state in response to that the 13th terminal has the seventh level, and is kept in an on-state in response to that the 13th terminal has the eighth level.

16. A control circuit comprising:
a power supply voltage adjustment circuit including a 1st terminal and a 2nd terminal, a level of the 2nd terminal changing after a level of the 1st terminal is changed;
a 1st line capable of electrically connecting the 1st terminal to a 1st memory group;
a 1st switch including a 3rd terminal, a 4th terminal, and a 5th terminal, the 1st switch electrically connecting the 3rd terminal to the 4th terminal when turned on;
a 2nd line electrically connecting the 1st terminal to the 3rd terminal;
a 3rd line capable of electrically connecting the 4th terminal to a 2nd memory group; and
a 4th line electrically connecting the 2nd terminal to the 5th terminal.

17. The control circuit according to claim 16, further comprising:
a 1st voltage detection circuit including a 6th terminal and a 7th terminal;
a 5th line electrically connecting the 3rd line to the 6th terminal;
a 2nd switch including an 8th terminal, a 9th terminal, and a 10th terminal, the 2nd switch electrically connecting the 8th terminal to the 9th terminal when turned on;
a 6th line electrically connecting the 1st terminal to the 8th terminal;
a 7th line capable of electrically connecting the 9th terminal to a 3rd memory group; and
an 8th line electrically connecting the 7th terminal to the 10th terminal.

18. The control circuit according to claim 16, wherein
the 1st switch further includes an 11th terminal, and
the control circuit further comprises:
a 1st voltage detection circuit including a 6th terminal and a 7th terminal;
a 9th line electrically connecting the 11th terminal to the 6th terminal;
a 2nd switch including an 8th terminal, a 9th terminal, and a 10th terminal, the 2nd switch electrically connecting the 8th terminal to the 9th terminal when turned on;
a 6th line electrically connecting the 1st terminal to the 8th terminal;
a 7th line capable of electrically connecting the 9th terminal to a 3rd memory group; and
an 8th line electrically connecting the 7th terminal to the 10th terminal.

19. The control circuit according to claim 17, further comprising:
a 2nd voltage detection circuit including a 12th terminal and a 13th terminal;
a 10th line electrically connecting the 7th line to the 12th terminal;

a 3rd switch including a 14th terminal, a 15th terminal, and a 16th terminal, the 3rd switch electrically connecting the 14th terminal to the 15th terminal when turned on;

an 11th line electrically connecting the 1st terminal to the 14th terminal;

a 12th line capable of electrically connecting the 15th terminal to a 4th memory group; and a 13th line electrically connecting the 13th terminal to the 16th terminal.

20. The control circuit according to claim 18, wherein the 2nd switch further includes a 17th terminal, and the control circuit further comprises:

a 2nd voltage detection circuit including a 12th terminal and a 13th terminal;

a 14th line electrically connecting the 17th terminal to the 12th terminal;

a 3rd switch including a 14th terminal, a 15th terminal, and a 16th terminal, the 3rd switch electrically connecting the 14th terminal to the 15th terminal when turned on;

an 11th line electrically connecting the 1st terminal to the 14th terminal;

a 12th line capable of electrically connecting the 15th terminal to a 4th memory group; and a 13th line electrically connecting the 13th terminal to the 16th terminal.

\* \* \* \* \*